United States Patent
Kameda et al.

(10) Patent No.: US 11,680,319 B2
(45) Date of Patent: Jun. 20, 2023

(54) ATOMIC LAYER DEPOSITION DEVICE AND ATOMIC LAYER DEPOSITION METHOD

(71) Applicant: MEIDENSHA CORPORATION, Tokyo (JP)

(72) Inventors: Naoto Kameda, Moriya (JP); Toshinori Miura, Chiba (JP); Mitsuru Kekura, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 17/637,899

(22) PCT Filed: Apr. 22, 2020

(86) PCT No.: PCT/JP2020/017310
§ 371 (c)(1),
(2) Date: Feb. 24, 2022

(87) PCT Pub. No.: WO2021/038958
PCT Pub. Date: Mar. 4, 2021

(65) Prior Publication Data
US 2022/0267902 A1  Aug. 25, 2022

(30) Foreign Application Priority Data
Aug. 30, 2019 (JP) ............................. JP2019-158128

(51) Int. Cl.
*C23C 16/455* (2006.01)
*C23C 16/40* (2006.01)
(52) U.S. Cl.
CPC ........ *C23C 16/45525* (2013.01); *C23C 16/40* (2013.01); *C23C 16/45565* (2013.01)
(58) Field of Classification Search
CPC . C23C 16/40; C23C 16/403; C23C 16/45525; C23C 16/45565
See application file for complete search history.

(56) References Cited

U.S. PATENT DOCUMENTS

2005/0172897 A1* 8/2005 Jansen .............. C23C 16/45551
                                                                    118/718
2007/0148350 A1* 6/2007 Rahtu ............... H01L 21/31641
                                                                   427/249.17
(Continued)

FOREIGN PATENT DOCUMENTS

CN        103930970 A     7/2014
JP        2001-304756 A   10/2001
(Continued)

OTHER PUBLICATIONS

News Release 2019, "Meiden Developed Groundbreaking Technology for Atomic Layer Deposition at Room Temperature" (online), Meidensha Corporation Homepage, Internet, http://www.meldensha.co.jp/news/news_03/news_03_01/1231056_2469.html, May 15, 2019.
(Continued)

*Primary Examiner* — Elizabeth A Burkhart
(74) *Attorney, Agent, or Firm* — Foley & Lardner LLP

(57) ABSTRACT

Disclosed is an ALD device in which a shower head is disposed at a position opposed to a film formation surface of a target workpiece in a chamber and has raw material gas ejection ports and OH* forming gas ejection ports alternately arranged at predetermined intervals in two film-formation-surface directions so as to face the film formation surface. The OH* forming gas ejection ports respectively include first ejection ports for ozone gas ejection and second ejection ports for unsaturated hydrocarbon gas ejection. An oxide film is formed on the film formation surface by ejecting a raw material gas from the raw material gas ejection ports and ejecting an ozone gas and an unsaturated hydrocarbon gas from the first and second ejection ports of the OH* forming gas ejection ports, respectively, while moving the target workpiece along the two film-formation-surface directions.

14 Claims, 4 Drawing Sheets

(56) References Cited

U.S. PATENT DOCUMENTS

| | | |
|---|---|---|
| 2009/0081886 A1 | 3/2009 | Levy et al. |
| 2010/0300482 A1 | 12/2010 | Miura |
| 2011/0262628 A1 | 10/2011 | Sferiazzo et al. |
| 2014/0335287 A1 | 11/2014 | Nagai et al. |
| 2018/0044492 A1* | 2/2018 | Miura .................. C01B 13/10 |
| 2018/0079764 A1 | 3/2018 | Harada et al. |
| 2018/0148558 A1* | 5/2018 | Miura .................. C08F 8/06 |

FOREIGN PATENT DOCUMENTS

| | | |
|---|---|---|
| JP | 2003-20209 A | 1/2003 |
| JP | 2008-294170 | 12/2008 |
| JP | 2010-153773 A | 7/2010 |
| JP | 2010-541242 A | 12/2010 |
| JP | 2014-057014 A | 3/2014 |
| JP | 2014-523479 A | 9/2014 |
| JP | 2014-220398 A | 11/2014 |
| JP | 2016-210742 A | 12/2016 |
| JP | 6052470 B1 | 12/2016 |
| JP | 6860048 B2 | 4/2021 |
| TW | 200930834 A | 7/2009 |

OTHER PUBLICATIONS

Abstract Book of 12th ACSIN-21 in conjunction with ICSPM 21, Production and Detection of OH Species by a Highly Concentrated Ozone Gas for Thin Film Processing, Tsukuba (2013), Japan Society of Applied Physics, Nov. 14, 2013, p. 98.

Convertech Magazine, Converting Technical Institute, Sep. 15, 2018, Sep. 2018 Edition, pp. 75-79.

News Release 2019, "Meiden Developed Groundbreaking Technology for Atomic Layer Deposition at Room Temperature" (online), Meidensha Corporation Homepage, Internet, http://www.meidensha.co.jp/news/news_03/news_03_01/1231056_2469.html.

Japanese Office Action and English translation, Application No. 2019-158128, dated Oct. 19, 2020, 4 pages.

\* cited by examiner

ATOMIC LAYER DEPOSITION DEVICE AND ATOMIC LAYER DEPOSITION METHOD

FIELD OF THE INVENTION

The present invention relates to an atomic layer deposition device and an atomic layer deposition method.

BACKGROUND ART

As techniques of forming thin films (hereinafter occasionally simply referred to as film formation) for advanced devices such as semiconductor devices (e.g. CPU circuits), there are typically known vapor deposition, sputtering, chemical vapor deposition (CVD) and atomic layer deposition (ALD). Among others, ALD is the most superior in terms of step coverage property and film density and has been regarded as an essential thin film formation technique for advanced devices (see Patent Document 1).

An ALD process is generally performed by repeated execution of the following four steps: evacuating the entire chamber (such as vacuum container) in which a target workpiece (e.g. silicon wafer) is placed; introducing a raw material gas (e.g. TMA (trimethylaluminum)) for ALD into the chamber; removing the raw material gas from the chamber; and supplying into the chamber an oxidant (e.g. water vapor) for oxidation of the raw material gas. By introducing the raw material gas into the chamber and filling the chamber with the raw material gas, the raw material gas is adhered in an amount of one molecular layer to a surface of the target workpiece whereby a molecular layer of the raw material gas is formed on a film formation surface of the target workpiece.

Then, the molecular layer of the raw material gas formed on the film formation surface is oxidized by supplying the oxidant for the raw material gas into the chamber. As a result, a thin-film molecular layer of an oxide of the raw material gas (e.g. a thin film of aluminum oxide) is formed on the target workpiece. By repeating the above-mentioned four steps, the thin film is provided with a film thickness according to the number of repetitions of the four-step process.

PRIOR ART DOCUMENTS

Patent Documents

Patent Document 1: Japanese Laid-Open Patent Publication No. 2014-057014
Patent Document 2: Japanese Laid-Open Patent Publication No. 2008-294170

Non-Patent Documents

Non-Patent Document 1: Abstract Book of 12th ACSIN-21 in conjunction with ICSPM 21, Tsukuba (2013), Japan Society of Applied Physics, Nov. 14, 2013, p. 98
Non-Patent Document 2: Convertech Magazine, Converting Technical Institute, Sep. 15, 2018, 2018 September Edition
Non-Patent Document 3: News Release 2019, "Meiden Developed Groundbreaking Technology for Atomic Layer Deposition at Room Temperature" (online), Meidensha Corporation Homepage, Internet, http://www.meidensha.co.jp/news/news_03/news_03_01/1231056_2469.html

SUMMARY OF THE INVENTION

In conventional ALD film formation processes, there is a tendency that the film formation temperature becomes high. For instance, in order to perform film formation by sufficient reaction between TMA and water vapor, it is necessary to heat the target workpiece to a relatively high temperature (e.g. 300° C. to 500° C.). In the case of performing film formation using a compound semiconductor such as GAN or ZnO for advanced devices, a plurality of semiconductor thin film layers of slightly different compositions may be stacked on the film formation surface of the target workpiece due to heteroepitaxy or MBE (molecular beam epitaxy). Since these semiconductor thin film layers can cause compositional deviations by heating, it is strongly demanded to perform the film formation at a low temperature.

For other advanced devices, there is an idea that that the temperature of film formation by ALD is preferably in the range of room temperature to 100° C. Thus, studies are being made on ALD processes using ozone ($O_3$) or plasma oxygen as the oxidant. The use of ozone leads to a reduction of film formation temperature because O radicals can be generated as a strong oxidant by thermal decomposition of ozone. Even in the case of ozone, however, it is still necessary to heat the target workpiece to several hundreds ° C. Even in the case of using plasma oxygen which enables supply of O radicals from the beginning and by which the most reduction of film formation temperature can be expected, the film formation temperature is only reduced to about 100° C. to 150° C.

In the conventional ALD film formation processes, there is also a tendency that the film formation time becomes long. In order to deposit one molecular layer by ALD, it is necessary to induce adsorption of the raw material gas onto the film formation surface, remove the residual raw material gas and then oxidize the raw material gas layer (adsorption layer) formed on the film formation surface. In general, several minutes are required to perform these process steps. In the case of aluminum oxide, for example, one molecular layer is about 0.1 nm in thickness. It is thus necessary to deposit about 100 atomic layers for the practical formation of an aluminum oxide film with a thickness of the order of 10 nm. Assuming the time required for deposition of one atomic layer is 1 minute, it takes about 100 minutes for such film formation. In other film formation processes such as CVD, for example, a film with a thickness of the order of 10 nm can be formed within 1 minute. The film formation time of the ALD process, which is longer than those of the other film formation processes, is considered as a significant demerit. It is demanded to shorten the film formation time of the ALD process.

The present invention has been made in view of the above circumstances. It is an object of the present invention to provide a technique which contributes to a reduction of film formation temperature and a shortening of film formation time in an ALD film formation process.

One aspect of the present invention is directed to an atomic layer deposition device for forming an oxide film on a film formation surface of a target workpiece, comprising: a chamber in which the target workpiece is placed; a support part that supports the target workpiece placed in the chamber movably along opposite two directions among four directions on the target workpiece; a shower head disposed in the chamber and opposed to the film formation surface of the target workpiece; and a gas discharge part that discharges a gas by suction to the outside of the chamber and maintains the inside of the chamber in a reduced pressure state.

This film formation device is characterized in that: the shower head comprises raw material gas ejection ports for ejecting a raw material gas into the chamber and OH* forming gas ejection ports for ejecting an ozone gas and an unsaturated hydrocarbon gas into the chamber; the raw material gas ejection ports and the OH* forming gas ejection ports are alternately arranged at predetermined intervals in the two directions so as to face the film formation surface of the target workpiece; and the OH* forming gas ejection ports have first ejection ports to eject therethrough the ozone gas and second ejection ports to eject therethrough the unsaturated hydrocarbon gas, respectively.

The shower head may comprise inert gas ejection ports respectively arranged between the raw material gas ejection ports and the OH* forming gas ejection ports to eject therethrough an inert gas into the chamber. The shower head may comprise gas discharge ports arranged between at least any one of the ejection ports.

The support part may comprise one end-side roll around which the target workpiece is previously wound and the other end-side roll around which the target workpiece fed from the one end-side roll is to be wound. Alternatively, the support part may comprise a support stage on which the target workpiece is supported and which is movable along the film formation surface of the target workpiece.

In the shower head, a plurality of ejection port pairs each constituted by one of the raw material gas ejection ports and one of the OH* forming gas ejection ports adjacent thereto may be arranged at predetermined intervals in the two directions. In the shower head, a plurality of the raw material gas ejection ports may be arranged in crossing directions that cross the two directions among the four directions on the film formation surface so as to constitute raw material gas ejection port groups; and a plurality of the OH* forming gas ejection ports may be arranged in the crossing directions so as to constitute OH* forming gas ejection port groups.

A dimension of the respective ejection ports of the shower head in the two directions may range from 1 mm to 50 mm. A distance from the respective ejection ports of the shower head to the film formation surface of the target workpiece may range from 1 mm to 20 mm. At least any of the ejection ports of the shower head may have a slit shape elongated in crossing directions that cross the two directions among the four directions on the film formation surface.

Another aspect of the present invention is directed to an atomic layer deposition method for forming an oxide film on a film formation surface of a target workpiece with the use of the above-mentioned atomic layer deposition device, comprising, while moving the target workpiece placed in the chamber along the two directions, performing on the film formation surface the following steps: a raw material gas supply step of supplying a raw material gas from the raw material gas ejection ports to the film formation surface of the target workpiece, thereby forming an adsorption layer of the raw material gas on the film formation surface, the raw material gas containing a constituent element of the oxide film; a raw material gas purging step of removing a residue of the raw material gas supplied in the raw material gas supply step and a gas generated by adsorption of the raw material gas to the film formation surface; an oxidant supply step of supplying an ozone gas with an ozone concentration of 20 vol % or higher and an unsaturated hydrocarbon gas from the OH* forming gas ejection ports to the film formation surface of the target workpiece, thereby oxidizing the adsorption layer formed on the film formation surface; and an oxidant purging step of removing a residue of the ozone and unsaturated hydrocarbon gases supplied in the oxidant supply step and a gas generated by oxidation of the adsorption layer of the raw material gas.

In the atomic layer deposition method, the pressure inside the chamber may be controlled to be lower than an atmospheric pressure by the gas discharge part of the atomic layer deposition device. Further, the pressure inside the chamber may be controlled to 1000 Pa or lower in the raw material gas purging step and in the oxidant purging step.

A plurality of cycles of the raw material gas supply step, the raw material gas purging step, the oxidant supply step and the oxidant purging step may be performed in such a manner as to supply different kinds of the raw material gas to the target workpiece in the raw material gas supply step of at least one of the plurality of cycles and in the raw material gas supply step of the remainder of the plurality of cycles. The oxide film may contain an adsorption layer of any of $Al_2O_3$, $HfO_2$, $TiO_2$, $ZnO$, $Ta_2O_3$, $Ga_2O_3$, $MoO_3$, $RuO_2$, $SiO_2$, $ZrO_2$ and $Y_2O_3$. The unsaturated hydrocarbon gas may be an ethylene gas.

Further, the target workpiece may be heated within the range of 100° C. or lower or may be kept unheated. A supply rate of the raw material gas may be set within the range of 0.0001 sccm to 1 sccm per unit length in a direction vertical to the two directions in the raw material gas ejection port. A supply rate of the ozone gas may be set within the range of 0.1 sccm to 10 sccm per unit length in a direction vertical to the two directions in the first ejection port. A supply rate of the unsaturated hydrocarbon gas may be set within the range of 0.1 sccm to 10 sccm per unit length in a direction vertical to the two directions in the second ejection port. A pressure on the film formation surface opposed to the respective ejection ports may be in the range of 0.1 Pa to 1000 Pa.

The above-described present invention enables a reduction of film formation temperature and a shortening of film formation time in the ALD film formation process.

DESCRIPTION OF EMBODIMENTS

Figure 1:
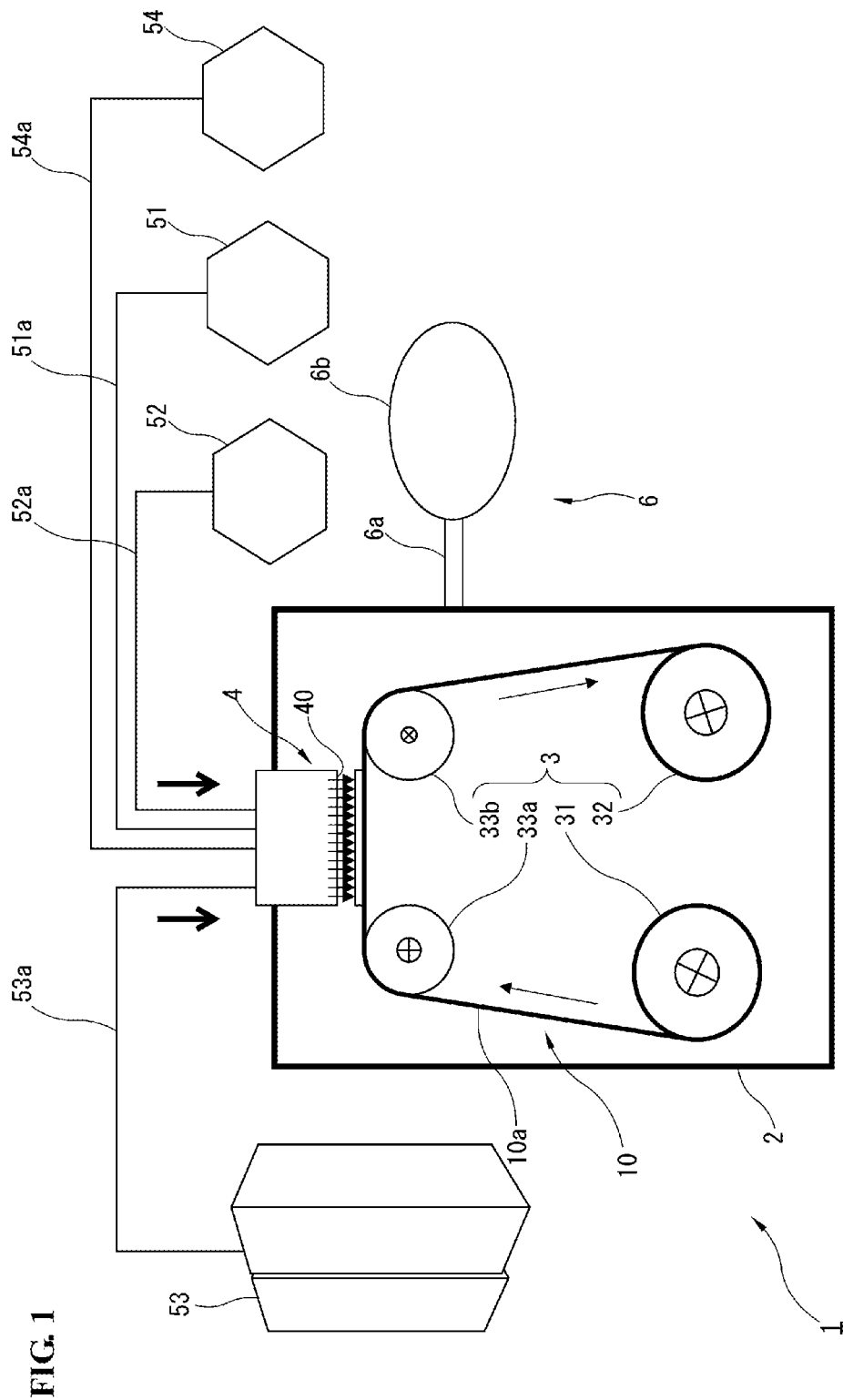
FIG. 1 is a schematic view showing an ALD device 1 according to one embodiment of the present invention.

According to one exemplary embodiment of the present invention, there are provided an atomic layer deposition device and an atomic layer deposition method using this atomic layer deposition device (hereinafter also respectively referred to as an ALD device and an ALD method), each for forming an oxide film on a film formation surface of a target workpiece while moving the target workpiece along opposite two directions among four directions on the film formation surface (hereinafter also simply referred to as two film-formation-surface directions) (more specifically, moving the target workpiece in one of the two film-formationsurface directions or reciprocating the target workpiece in both of the two film-formation-surface directions).

The ALD device includes: a chamber in which the target workpiece is placed; and a shower head disposed at a position opposed to the film formation surface of the target workpiece in the chamber. The shower head has raw material gas ejection ports for ejecting a raw material gas into the chamber and OH* forming gas ejection ports for ejecting an ozone gas and an unsaturated hydrocarbon gas into the chamber.

The raw material gas ejection ports and the OH* forming gas ejection ports are alternately arranged at predetermined intervals in the two film-formation-surface directions so as to face the film formation surface of the target workpiece. The OH* forming gas ejection ports respectively have first ejection ports to eject therethrough the ozone gas and second ejection ports to eject therethrough the unsaturated hydrocarbon gas.

In the present embodiment, it is possible to individually perform a raw material gas supply step, a raw material gas purging step, an oxidant supply step and an oxidant purging step on the film formation surface of the target workpiece while moving the target workpiece.

For example, the oxide film can be formed by, after adsorption of the raw material gas for ALD to the film formation surface, supplying the ozone gas with a high ozone concentration of preferably 20 vol % or higher, more preferably 80 vol % or higher, and the unsaturated hydrocarbon gas to the film formation surface and thereby oxidizing the raw material gas adsorbed onto the film formation surface. In other words, OH* (OH radicals) generated by reaction of the ozone and the unsaturated hydrocarbon is used as an oxidant for oxidation of the raw material gas.

The ALD method using the ozone and the unsaturated hydrocarbon enables formation of the oxide film at a low temperature, whereby the oxide film can be appropriately applied to not only relatively high heat-resistant substrates such as Si substrate but also substrates or films made of relatively low heat-resistant synthetic resins.

As mentioned above, the ALD device and ALD method according to the present embodiment are for forming the oxide film on the film formation surface of the target workpiece while moving the target workpiece along the two film-formation-surface directions. The atomic layer deposition device and method can be embodied in any form capable of individually performing the raw material gas supply step, the raw material gas purging step, the oxidant supply step and the oxidant purging step on the target workpiece while moving the target workpiece. It is feasible to modify the design of the atomic layer deposition device and method by appropriately applying the common general technical knowledge of various fields (such as film formation by ALD, CVD etc., chamber, ozone gas, unsaturated hydrocarbon and the like).

[General Configuration of ALD Device 1 According to Present Embodiment]

A general configuration of the ALD device 1 according to the present embodiment is shown in FIG. 1. As shown in FIG. 1, the ALD device 1 includes a chamber (reaction container) 2 in which a target workpiece 10 is removably placed such that a desired oxide film (illustrated as oxide film 11 in FIG. 2) can be formed on a film formation surface 10a of the target workpiece 10. A support part 3 is provided in the chamber 2 to support the target workpiece 10 placed in the chamber 2 movably in the longitudinal direction along the film formation surface 10a (two film-formation-surface directions).

In the illustrated embodiment of FIG. 1, the support part 3 is of the so-called roll-to-roll type. More specifically, the support part 3 has: one end-side roll 31 as a winding shaft around which one end side of the elongated film-shaped target workpiece 10 is wound; the other end-end roll 32 as a winding shaft around which the other end side of the elongated film-shaped target workpiece 10 is wound; and transport rolls 33a and 33b disposed between the one end-side roll 31 and the other end-side roll 32. The respective rolls are adapted to rotate as appropriate.

Thus, the support part 3 is so configured that the target workpiece 10 is fed from one of the end-side rolls 31 and 32, transported by the transport rolls 33a and 33b and wound around the other of the end-side rolls 31 and 32. In other words, the support part 3 allows appropriate movement of the target workpiece 10 along the two film-formation-surface directions. In the support part 3 of FIG. 1, both of the transport rolls 33a and 33b are located, with a predetermined space left therebetween, in an upper portion of the chamber 2 so that the film formation surface 10a of the target workpiece 10 transported between these transport rolls is opposed to the upper side of the chamber 2 (that is, opposed to the after-mentioned shower head 4).

The shower head 4 is disposed on the upper side of the chamber 2 so as to face the film formation surface 10a of the target workpiece 10 transported between the transport rolls 33a and 33b. A raw material supply unit 51, an unsaturated hydrocarbon supply unit 52, an ozone generation unit 53 and an inert gas supply unit 54 are connected to the shower head 4 via pipes 51a, 52a, 53a and 54a, respectively, so as to allow gas supplies from the respective units 51 to 54 into the chamber 2 as appropriate. A gas discharge part 6 is provided on the chamber 2 at a position away from the shower head 4 (in FIG. 1, at a lateral position) to suck and discharge a gas inside the chamber 2 to the outside of the chamber 2 and maintain the inside of the chamber 2 in a reduced pressure state.

<Another Example of Support Part 3>

The support part 3 is not limited to the roll-to-roll type shown in FIG. 1 and can be of any type capable of supporting the target workpiece 10 in the chamber 2 movably in the film-formation-surface direction. For example, the support part may alternatively be of the type having a support stage (such as a stage designated by reference numeral 7 in FIG. 1 of Japanese Patent No. 6052470) to support thereon the target workpiece 10 (simply referred to as support stage type). In this case, the support stage is set movable along the two film-formation-surface directions (so as to allow the film formation surface 10a to face the shower head 4).

<Example of Shower Head 4>

Figure 2:
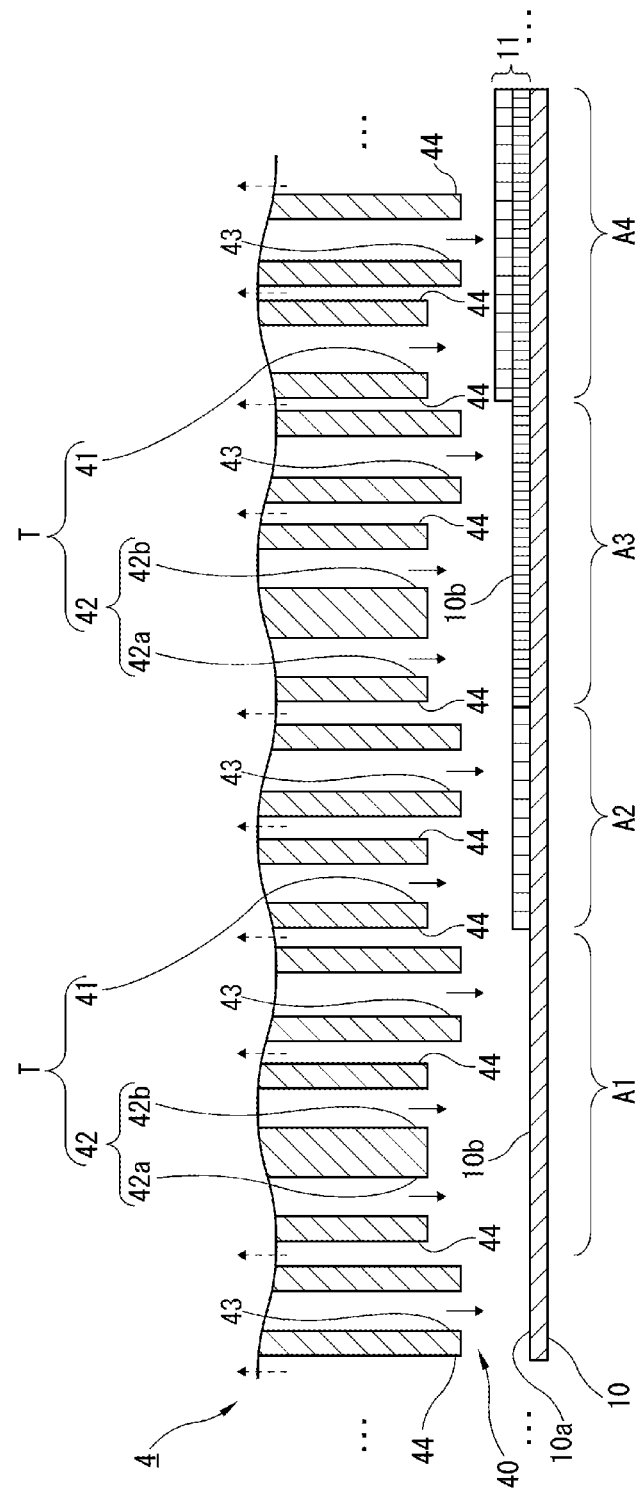
FIG. 2 is a schematic cross-sectional view showing a shower head 4 of the ALD device 1 and a target workpiece 10 (as taken in cross section in two film-formation-surface directions).

One example of the shower head 4 is shown in FIG. 2. As shown in FIG. 2, a plurality of raw material gas ejection ports 41 and a plurality of OH* forming gas ejection ports 42 are formed in a portion 40 of the shower head 4 opposed to and facing the film formation surface 10a of the target workpiece 10 transported between the transport rolls 33a and 33b. Each of the raw material gas ejection ports 41 is in communication with the raw material supply unit 51 (via the pipe 51a) so that the raw material gas is ejected from these ejection ports into the chamber 2. Each of the OH* forming gas ejection ports 42 is in communication with the unsaturated hydrocarbon supply unit 52 or the ozone generation unit 53 (via the pipe 52a or 53a) so that the ozone gas and the unsaturated hydrocarbon gas are ejected from these ejection ports into the chamber 2.

The raw material gas ejection ports 41 and the OH* forming gas ejection ports 42 are arranged alternately at predetermined intervals in the two film-formation-surface directions. In the present embodiment, a plurality of ejection port pairs each constituted by one of the raw material gas ejection ports 41 and one of the OH* forming gas ejection ports 42 adjacent thereto (as designated by reference T in FIG. 2) are arranged at predetermined intervals in the two film-formation-surface directions.

The OH* forming gas ejection ports 42 respectively have first ejection ports 42a to eject therethrough the ozone gas and second ejection ports 42b to eject therethrough the unsaturated hydrocarbon gas. The first ejection port 42a and the second ejection port 42b are arranged adjacently side by side in the two film-formation-surface directions.

The shower head also has inert gas ejection ports 43 respectively arranged between the raw material gas ejection ports 41 and the OH* forming gas ejection ports 42. Each of the inert gas ejection ports 43 is in communication with the inert gas supply unit 54 (via the pipe 54a) so that an inert gas is ejected from these ejection ports into the chamber 2. Further, the shower head has discharge ports 44 between respective adjacent ones of the raw material gas ejection ports 41, the OH* forming gas ejection ports 42 and the inert gas ejection ports 43. The discharge ports 44 between the respective adjacent ejection ports are adapted to suck and discharge any gas existing between the film formation surface 10a and the discharge ports 44 to the outside of the chamber 2.

<Example of Ejection Ports 41 to 43 and Discharge Ports 44>

The raw material gas ejection ports 41, the OH* forming gas ejection ports 42, the inert gas ejection ports 43 and the discharge ports 44 (generically simply referred to as ejection ports) may be not only aligned in a plurality of rows in the two film-formation-surface directions but also aligned in a plurality of rows in crossing directions that cross the two film-formation-surface direction (hereinafter also simply referred to as crossing directions). For example, it is feasible to form raw material gas ejection port groups by aligning a plurality of the raw material gas ejection ports 41 in the crossing directions and to form OH* forming gas ejection port groups by aligning a plurality of the OH* forming gas ejection ports in the crossing directions.

The forms (shapes and sizes) of the respective ejection ports and the distances from the respective ejection ports to the film formation surface 10a of the target workpiece 10 are not necessarily the same and may be set to different values. For example, the respective ejection ports can be formed into a circular shape, a rectangular shape, an oval shape, a slit shape etc.

Figure 3:
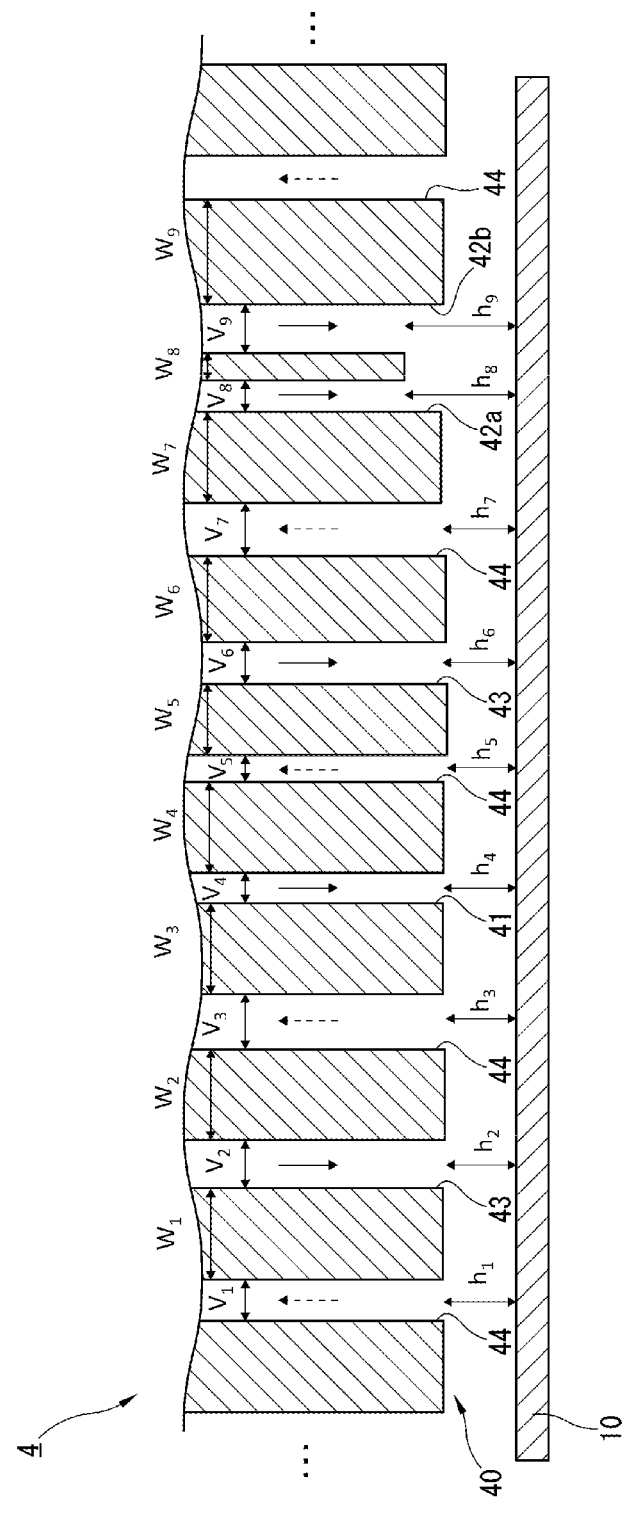
FIG. 3 is a schematic cross-sectional view showing respective ejection ports of the shower head 4 of the ALD device 1 (as taken in cross section in two film-formation-surface directions and corresponding to a part of FIG. 2).

The dimensions V1 to V9 of the respective ejection ports in the film-formation-surface directions (in the case where the ejection ports are slit-shaped, the slit widths of the respective ejection ports) as shown in FIG. 3 may preferably be set within the range of $10^{-1}$ mm to several tens mm, more preferably 1 mm to 50 mm. Further, the distances h1 to h9 from the respective ejection ports to the film formation surface 10a of the target workpiece 10 may preferably be set within the range of several mm to several hundreds mm, more preferably 1 mm to 100 mm, still more preferably 1 mm to 20 mm. In the illustrated embodiment of FIG. 3, the distances h8 and h9 from the OH* forming gas ejection ports 42 to the film formation surface are set larger than the distances h1 to h7 from the other ejection ports to the film formation surface.

The pitches between the ejection ports (as designated by W1 to W9 in FIG. 3) are set as appropriate in view of the opening dimensions of the ejection ports. For supply of the reactive species (OH) to the film formation surface 10a, the pitch between the first ejection port 42a and the second ejection port 42b (as designated by W8 in FIG. 3) is set narrower than those between the other ejection ports in the illustrated embodiment.

<Example of Gas Discharge Part 6>

The gas discharge part 6 can be in various forms as long as it is capable of sucking and discharging a gas inside the chamber 2 to the outside of the chamber 2 and maintaining the inside of the chamber 2 in a reduced pressure state. For example, the gas discharge part 6 has a discharge pipe 6a equipped with a vacuum pump 6b as shown in FIG. 1. Alternatively, the gas discharge part 6 may be provided with an ozone killer (i.e. a removal cylinder capable of decomposing ozone; not specifically shown) and a gas discharge valve (i.e. a valve having a variable opening; not specifically shown) and the like.

As a specific example of control of the reduced pressure state inside the chamber 2 by the gas discharge part 6, the pressure inside the chamber 2 may be reduced and adjusted to several thousands Pa or lower (e.g. about 1000 Pa or lower), preferably several hundreds Pa or lower (e.g. about 130 Pa). It is preferable that the vacuum pump 6b is of the type resistance to ozone (as exemplified by a dry pump).

<Example of Target Workpiece 10>

The target workpiece 10 is not particularly limited as long as it is capable of being movably supported by the support part 3 (e.g. roll-to-roll type or support stage type support part) such that the oxide film can be formed on the film formation surface 10a of the target workpiece 10 with movement of the target workpiece 10 along the two film-formation-surface directions.

In the technique of forming the oxide film with the use of the ozone and unsaturated hydrocarbon as in the present embodiment, the oxide film can be formed at a relatively low temperature. Thus, the target workpiece is not limited to a relatively a relatively high heat resistant substrate or film etc. such as Si substrate. The oxide film can be formed on a substrate or film made of a relatively low heat resistant synthetic resin.

In the case where the target workpiece 10 is made from a resin material, examples of the resin material used include polyester resin, aramid resin, olefin resin, polypropylene, PPS (polyphenylene sulfide), PET (polyethylene terephthalate) and the like.

As the resin material, PE (polyethylene), PEN (polyethylene naphthalate), POM (polyoxymethylene; also called acetal resin), PEEK (polyether ether ketone), ABS resin (acrylonitrile-butadiene-styrene copolymerization synthetic resin), PA (polyamide), PFA (tetrafluoroethylene-perfluoroalkoxyethylene copolymer), PI (polyimide), PVD (polyvinyl dichloride) and the like are also usable.

The shape of the target workpiece 10 can be a solid shape, a film shape, a sheet shape, a fabric shape, a fiber shape or the like. In FIG. 1, the target workpiece 10 is formed in an elongated film shape. In this case, either or both of flat front and back surfaces of the target workpiece extending in the longitudinal direction serve as the film formation surface 10a (in FIG. 1, one of the front and back surfaces of the target workpiece serves as the film formation surface 10a). The elongated film-shaped target workpiece 10 is supported by the support part 6 movably in the longitudinal direction (two film-formation-surface directions).

For the purpose of improvement in film forming performance, it is feasible to heat the target workpiece 10 as appropriate (by means of any heating mechanism such as thermocouple or infrared heater; not specifically shown).

For example, the target workpiece may be heated as needed such that the film formation temperature of the film formation surface 10a ranges from e.g. room temperature to 100° C.

<Example of Raw Material Gas>

The raw material gas used is a gas containing a constituent element of the oxide film (such as lithium (Li), magnesium (Mg), silicon (Si), titanium (Ti), vanadium (V), chromium (Cr), manganese (Mn), iron (Fe), cobalt (Co), nickel (Ni), copper (Cu), zinc (Zn), gallium (Ga), germanium (Ge), yttrium (Y), zirconium (Zr), molybdenum (Mo), ruthenium (Ru), rhodium (Rh), indium (In), tin (Sn), hafnium (Hf), tantalum (Ta), tungsten (W), iridium (Ir), platinum (Pt) and lead (Pb); hereinafter referred to as metal or metal element). For example, the raw material gas can be a gas containing an organic silicon compound with a Si—O bond or Si—C bond or an organometallic compound with a metal-oxygen bond or metal-carbon bond and a gas containing an organometallic complex or a hydride of silicon or metal.

Specific examples of the raw material gas include those using silane (that is a generic name for hydrogen silicate), TEOS (tetraethyl orthosillicate), TMS (trimethoxysilane), TES (triethoxysilane), TMA (trimethyl aluminum), TEMAZ (tetrakis(ethylmethylamino)zirconium) and the like. As the raw material gas, a gas of heterogeneous polynuclear complex containing a plurality of kinds of metal elements (as disclosed in e.g. Japanese Laid-Open Patent Publication No. 2016-210742), rather than containing one kind of metal element, is also usable.

The raw material gas may be supplied into the chamber 2 (e.g. at a rate of 1 LSM or lower) with the use of a carrier gas (such as $N_2$, Ar, He etc.).

<Example of Ozone Gas>

Although the ozone gas can be used at various concentrations, it is preferable that the ozone concentration is as high as possible. The ozone concentration (vol %) of the high concentration ozone gas is preferably in the range of 20 to 100 vol %, more preferably 80 to 100 vol %. The reason for this is that, as the ozone concentration is closer to 100 vol %, the reactive species (OH) generated from the ozone gas reaches the surface of the target workpiece at a higher density.

The reactive species (OH) not only participates in the reaction required for ALD, but also reacts with carbon (C) contained as an impurity in the film to remove the impurity carbon (C) in gaseous form. Accordingly, the oxide film is formed with less impurity by supplying a larger amount of the reactive species (OH) to the film formation surface. In view of the tendency that the higher the ozone concentration of the ozone gas (i.e. the lower the oxygen concentration of the ozone gas), the longer the lifetime of atomic oxygen (O) generated by dissociation of the ozone, it is preferable to use the ozone gas of high concentration. As the ozone concentration is higher, the oxygen concentration is lower so that the atomic oxygen (O) is prevented from being deactivated by collision with the oxygen molecule. Further, the process pressure during the oxide film formation process can be decreased with increase of the ozone concentration. It is thus preferable to use the high concentration ozone gas from the viewpoint of gas flow control and gas flow improvement as well as the above-mentioned atomic oxygen lifetime tendency.

The ozone gas can be obtained by liquefying and separating ozone from an ozone-containing gas on the basis of a difference in vapor pressure, and then, gasifying the liquefied ozone. As a device for generating the ozone gas (high concentration ozone gas), there can be used any of ozone gas generators disclosed in patent documents such as Japanese Laid-Open Patent Publication No. 2001-304756 and Japanese Laid-Open Patent Publication No. 2003-20209. These ozone gas generators are each configured to generate a high concentration ozone gas (ozone concentration≈100 vol %) by isolating ozone through liquefaction separation based on a difference in vapor pressure between ozone and another gas (e.g. oxygen). The ozone gas generator, particularly of the type having a plurality of chambers for liquefying and gasifying only ozone, enables continuous supply of the high concentration ozone gas by individual temperature control of the chambers. For example, Pure Ozone Generator (MPOG-HM1A1) manufactured by Meidensha Corporation is known as one commercially available example of the high concentration ozone gas generator.

<Example of Unsaturated Hydrocarbon Gas>

The unsaturated hydrocarbon gas used is a gas containing a hydrocarbon with a double bond (also called alkene) such as ethylene or a gas with a triple bond (also called alkyne) such as acetylene. In addition to ethylene and acetylene, a low-molecular-weight unsaturated hydrocarbon (e.g. an unsaturated hydrocarbon having a carbon number n of 4 or less) such as propylene, butylene etc. is also suitably usable as the unsaturated hydrocarbon. It is preferable that, at the time when the unsaturated hydrocarbon gas containing the aforementioned unsaturated hydrocarbon is supplied for reaction with the raw material gas and the high concentration ozone gas, the amount of water contained in the unsaturated hydrocarbon gas is small. The reason for this is that, when the gas used in the reaction contains a large amount of water, there arises a possibility of dust generation by reaction of the water and the raw material gas. For example, the unsaturated hydrocarbon gas used preferably has an atmospheric dew point (frost point) of −50° C. or lower as determined according to JIS Z 8806 (at an atmospheric pressure of 1013.25 hPa). Similarly, the after-mentioned purge gas preferably has an atmospheric dew point (frost point) of −50° C. or lower.

<Example of Inert Gas>

The inert gas can be of any kind as long as it is usable in the raw material gas pursing step and in the oxidant purging step. Examples of the inert gas include $N_2$, Ar, He and the like.

<Gas Flow Rate and Pressure>

The flow rates of the raw material gas, the ozone gas, the unsaturated hydrocarbon gas and the inert gas and the pressures due to ejections of these respective gases (i.e. pressures between the respective ejection ports and the film formation surface 10a) are set as appropriate in view of the supply of the reactive species (OH) to the film formation surface 10a, the pitches between the ejection ports, the moving speed of the target workpiece 10 in the two film-formation-surface directions and the like.

For example, the flow rate (supply rate) of the ozone gas can be set as appropriate in view of the supply of the reactive species (OH) to the film formation surface 10a. Preferably, the flow rate (supply rate) of the ozone gas is set equal to or higher than twice (e.g. about two to three times as high as) the flow rate (supply rate) of the unsaturated hydrocarbon gas.

The purpose of setting the flow rate of the ozone gas higher than or equal to the flow rate of the unsaturated hydrocarbon gas as mentioned above is based on the assumption that the decomposition of the unsaturated hydrocarbon gas to OH group proceeds in a plurality of steps. Under this assumption, it is considered that a sufficient amount of OH group may not be obtained due to shortage of the ozone molecule required for the reaction when the ozone gas and the unsaturated hydrocarbon gas are supplied at a ratio of ozone molecule:unsaturated hydrocarbon molecule=1:1.

As specific examples of the flow rates of the ozone gas and the unsaturated hydrocarbon gas, each of the flow rates of the ozone gas and the unsaturated hydrocarbon gas may be set within the range of 0.1 sccm to 10 sccm per unit length in a direction vertical to the two film-formation-surface directions in the first or second ejection port 42a, 42b.

Furthermore, the flow rate of the raw material gas may be set to 0.0001 sccm to 1 sccm per unit length in a direction vertical to the two film-formation-surface directions in the raw material gas ejection port 41 as a specific example of the flow rate of the raw material gas.

As a specific example of the flow rate of the inert gas, the flow rate of the inert gas may be set to a value within the range that the pressure between the inert gas ejection port 43 and the film formation surface 10a does not become too high (e.g. does not exceed 1000 Pa and, more specifically, ranges from 0.1 Pa to 1000 Pa) and be set higher than the flow rate of the ozone gas. The pressures between the raw material gas ejection port 41 and the film formation surface 10a and between the OH* forming gas ejection port 42 and the film formation surface 10a may also be controlled so as not to become too high (e.g. so as to not exceed 1000 Pa and, more specifically, range from 0.1 Pa to 1000 Pa).

The moving speed of the target workpiece 10 along the two film-formation-surface directions is set as appropriate in view of the pitches between the ejection ports and the like. Depending on the magnitude of the target workpiece moving speed etc., there occurs convection between the respective ejection ports and the film formation surface 10a so as to allow easy mixing of the ozone gas and the unsaturated hydrocarbon gas. In this case, the mixed gas of the ozone gas and the unsaturated hydrocarbon gas can efficiently act on the film formation surface 10a.

<Example of Oxide Film Formation by ALD Device 1>

Figure 4:
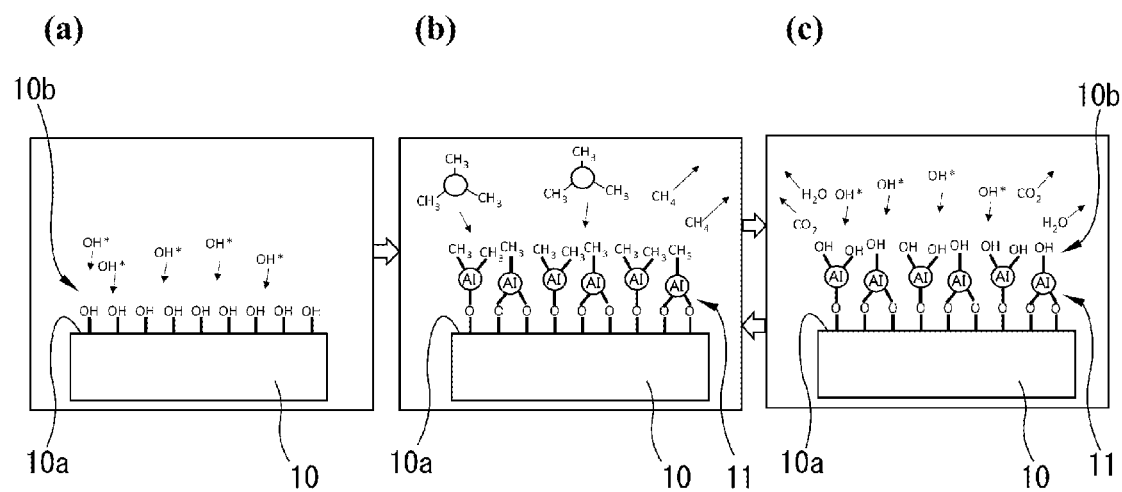
FIG. 4 is a reaction scheme showing one example of oxide film formation by the ALD device 1.

One example of oxide film formation by the ALD device 1 will be described below with reference to FIGS. 1 to 4. Herein, FIG. 4, shows a scheme of reaction in the case of forming an oxide film 11 of $Al_2O_3$ on the film formation surface 10a with the use of TMA as the raw material gas.

In the case where the target workpiece 10 supported by the support part 6 is fed from the one end-side roll 31 to the other end-side roll 32 as shown in FIG. 1 (in FIG. 2, from the left side to the right side), for example, areas A1 to A4 of the film formation surface 10a pass successively as shown in FIG. 2. The following steps are performed on the respective areas A1 to A4.

On the area A1, the ozone gas and the unsaturated hydrocarbon gas are respectively ejected from the first and second ejection ports 42a and 42b of the OH* forming gas ejection port 42 in the oxidant supply step. The ozone gas and the unsaturated hydrocarbon gas are mixed and reacted with each other in the space between the first and second ejection ports 42a and 42b and the film formation surface 10a (e.g. in the vicinity of the film formation surface 10a), thereby generating OH* as the oxidizing species.

When this is the first time the oxidant supply step takes place (that is, the oxide film 11 has not yet been formed on the area A1 of the film formation surface 10a), the OH* act on the film formation surface 10a as shown in the reaction scheme of FIG. 4(a). As a consequence, an adsorbable area 10b to which the raw material gas is adsorbable (that is, an area on which an adsorption layer of the raw material gas (oxide film 11) can be formed) is provided (e.g. uniformly) on the film formation surface 10a.

When the oxidant supply step is performed for the second or subsequent time (see the area A3 or subsequent area in FIG. 3), the film formation surface 10a is in a state where there has been formed the oxide film 11 due to the adsorption of the raw material gas by the after-mentioned raw material gas supply step. Consequently, the raw material gas adsorbed on the oxide film 11 is oxidized by the OH* as shown in the reaction scheme of FIG. 4(c) so that there is provided an adsorbable area 10b for the next film formation.

Thus, the oxidant supply step performed for the first time corresponds to a step of pretreatment of the film formation surface 10a; and the oxidant supply step performed for the second or subsequent time corresponds to a step of oxidation of the raw material gas adsorbed onto the film formation surface 10a.

After the oxidant supply step on the area A1, a residue of the ozone and unsaturated hydrocarbon gases supplied in the oxidant supply step (when this is the second or subsequent time the oxidant supply step is performed, such a residual gas and a gas generated by oxidation of the adsorption layer of the raw material gas) is removed by means of the gas discharge part 6 and the discharge ports 44 or by means of the oxidant purging step. In the oxidant purging step, the inert gas is ejected from the inert gas ejection ports 43 to remove the residual gas etc. from the area A1.

On the area A2, the raw material gas is ejected from the raw material gas ejection port 41 in the raw material gas supply step. As shown in the reaction scheme of FIG. 4(b), the raw material gas is adsorbed to the adsorbable area 10b of the film formation surface 10a so that an adsorption layer of the raw material gas (oxide film 11) is formed. In FIG. 4(b), illustrated is a state where one molecular layer of TMA gas is adsorbed.

After the raw material gas supply step on the area A2, a residue of the raw material gas supplied in the raw material gas supply step and a gas (such as $CH_4$ gas) generated by adsorption of the raw material gas to the film formation surface are removed by means of the gas discharge part 6 and the discharge ports 44 or by means of the raw material gas pursing step. In the raw material gas purging step, the inert gas is ejected from the inert gas ejection port 43 to remove the residual raw material gas etc. from the area A2.

The above respective steps are performed on the subsequent areas A3 and A4 in the same manner as performed on the areas A1 and A2. On the area A3, the ozone gas and the unsaturated hydrocarbon gas are respectively ejected from the first and second ejection ports 42a and 42b of the OH* forming gas ejection port 42 in the same manner as the area A1. The ozone gas and the unsaturated hydrocarbon gas are mixed and reacted with each other, thereby generating OH* as the oxidizing species (oxidant supply step). By the action of OH* on the area A3, methyl groups ($CH_3$) on the film formation surface 10a are oxidized as shown in the reaction scheme of FIG. 4(c). The film formation surface 10a is consequently provided with an adsorbable area 10b for the next film formation. The oxidation reaction shown in the reaction scheme of FIG. 4(c) can proceed even at room temperature (25° C.).

After the oxidant supply step on the area A3, a residue of the ozone and unsaturated hydrocarbon gases supplied in the oxidant supply step and a gas generated by oxidation of the adsorption layer of the raw material gas are removed by means of the gas discharge part 6 and the discharge ports 44 or by means of ejection of the inert gas from the inert gas ejection port 43 (oxide gas purging step).

On the area A4, the raw material gas is ejected from the raw material gas ejection port 41 in the same manner as the area A2. As shown in the reaction scheme of FIG. 4(*b*), the raw material gas is adsorbed to the adsorbable area of the oxide film 11 so that an adsorption layer of the raw material gas (another layer of oxide film 11) is formed (raw material gas supply step).

After the raw material gas supply step on the area A4, a residue of the raw material gas supplied in the raw material gas supply step and a gas generated by adsorption of the raw material gas to the oxide film 11 are removed by means of the gas discharge part 6 and the discharge port 44 or by means of the raw material gas purging step (raw material gas purging step).

As described above, the oxide film 11 is formed as desired on the film formation surface 10*a* by performing each of the raw material gas supply step, the raw material gas purging step, the oxidant supply step and the oxidant purging step as appropriate. Further, the oxide film 11 is formed with a desired thickness by performing a plurality of cycles of the above-mentioned process steps.

As a technique to perform a plurality of cycles of the process steps, it is feasible to perform the respective process steps a plurality of times on the area A3, A4 (i.e. alternately perform operations of FIGS. 4(*b*) and (*c*)) by reciprocating the target workpiece 10 in the two film-formation-surface directions after performing the respective process steps on the areas A1 to A4.

In the case where a plurality of cycles of the above-mentioned process steps are performed, the raw material gas supplied to the target workpiece in the raw material gas supply step of at least one of the cycles and the raw material gas supplied to the target workpiece in the raw material gas supply step of the remainder of the cycles may be of different kinds so as to form the oxide film 11 with a multilayer structure of adsorption layers of different kinds of raw material gases (i.e. the oxide film 11 in which a plurality of adsorption layers are staked).

Figure 5:
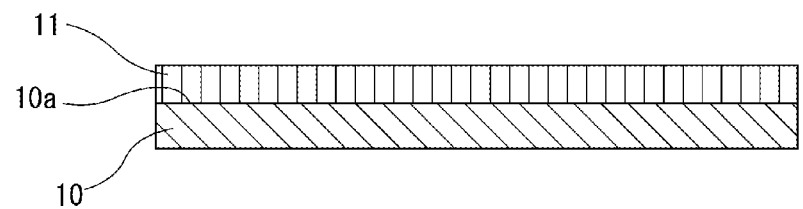
FIG. 5 is a schematic cross-sectional view showing one example of oxide film formed by the ALD device 1 (as taken in cross section in two film-formation-surface directions).

When an oxide film 11 of $Al_2O_3$ with a thickness of 40 nm was formed on the film formation surface as shown in FIG. 5 by using PEN, TMA and ethylene gas as the target workpiece 10, the raw material gas and the unsaturated hydrocarbon gas, respectively, and performing the above-mentioned process steps as appropriate at a film formation temperature in the vicinity of room temperature, it was confirmed that the thus-formed oxide film had equivalent film quality (such as a high barrier film property with a water vapor permeability of the order of $6.5 \times 10^{-5}$ g/m$_2$/day) to those of oxide films formed by an ALD method of Non-Patent Document 3.

The above-embodied ALD device 1 and ALD method enables film formation by ALD at lower temperatures. More specifically, the film formation can be carried out at low temperatures of 100° C. or lower by the use of OH* for oxidation of the raw material gas in ALD. It is consequently possible to form the oxide film 11 as desired on the film formation surface 10*a* of the target workpiece 10 at room temperature (25° C.), without heating of the target workpiece 10 or with cooling of the target workpiece 10 etc.

The rate of reaction of OH radicals to organic compounds is an order of magnitude higher than that of O radicals. For example, the reaction rate of OH radicals with a raw material gas having a single bond of carbon (such as TMA) is about 100 times higher than that of O radicals. Thus, the film formation temperature can be further reduced (e.g. to 100° C. or lower) with the use of the OH radicals than with the use of plasma oxygen.

As the gas can be uniformly ejected to the film formation surface 10*a* by the shower head 4, it is possible to improve the in-plane uniformity of the oxide film formed on the film formation surface 10*a*. It is further possible to more uniformize the thickness of the oxide film as the adsorbable area 10*b* to which the raw material gas is adsorbable can be uniformly formed on the film formation surface 10*a*. In the case of forming an oxide film by a conventional ALD process where the entire chamber is filled with an ALD raw material gas and an oxidant gas, the oxide film tends to have a distribution of film thickness and quality between upstream and downstream sides of the respective gas flows unless the entire chamber is uniformly filled with the ALD raw material gas and the oxidant gas.

The ALD device 1 according to the present embodiment allows film formation only on a region of the film formation surface 10*a* opposed to and facing the shower head 4 (opposed to and facing the respective ejection ports). The reason for this is assumed to be that, because of the very short lifetime of OH radicals generated as the oxidant by ejecting the ozone gas and the unsaturated hydrocarbon gas from the shower head 4 and blowing the ozone gas and the unsaturated hydrocarbon gas uniformly onto the film formation surface 10*a*, the OH radicals are deactivated and do not serve as the oxidant on any region other than the region opposed to and facing the shower head 4. There does not occur the problem of film formation on unnecessary regions such as chamber wall as in the conventional ALD process. It is thus possible to obtain a reduction of maintenance cost in the present embodiment.

Since the raw material gas, the ozone gas and the unsaturated hydrocarbon gas can be supplied in sufficient amounts only by being ejected from the shower head 4 and blown onto the film formation surface 10*a*, it is not necessary to fill the entire chamber 2 with these gases as in the conventional ALD process. It is thus possible in the present embodiment to form the oxide film using smaller amounts of the raw material gas, the ozone gas and the unsaturated hydrocarbon gas as compared to the conventional ALD process.

In the ALD device and ALD method according to the present embodiment, the oxidant is provided in a plasmaless manner. It can be thus said that there is less plasma damage to the target workpiece 10 and the oxide film formed on the target workpiece 10 in the present embodiment as compared to the conventional ALD process.

Although the ALD device and ALD method according to the present invention has been described above by way of the specific embodiment, the ALD device and ALD method according to the present invention is not limited to those of the above-described specific embodiment. Various modifications and variations of the above-described embodiment are possible within the range that does not impair the features of the present invention. All such modifications and variations fall within the technical scope of the present invention.

For example, a CVD process may be performed before or after the ALD film formation process so as to form a multilayer film structure with an ALD layer and a CVD layer on the film formation surface 10*a* of the same target workpiece 10. In one such modification example, it is feasible to form high elastic-resistant $SiO_2$ films at high film forming speed by CVD and form a high water vapor permeable $Al_2O_3$ film between these $SiO_2$ films by ALD. This leads to low-temperature formation of a multilayer film structure having multi-functionality which cannot be achieved by a single layer film.

The constituent components of the ALD device 1 may be omitted as appropriate within the range that the ALD device is capable of forming the desired oxide film 11 on the film formation surface 10a. In the case where the oxidant purging step and the raw material gas pursing step are sufficiently executed by controlling the gas discharge part 6 to suck the gas inside the chamber 2, for example, it is feasible to omit the inert gas ejection ports 43 etc. as appropriate or to omit the discharge ports 43 between the ejection holes (e.g. provide the discharge ports only between some of the ejection holes) as appropriate.

The invention claimed is:

1. An atomic layer deposition method for forming an oxide film on a film formation surface of a target workpiece with the use of an atomic layer deposition device, the atomic layer deposition device comprising: a chamber in which the target workpiece is placed; a support part that supports the target workpiece placed in the chamber movably along opposite two directions among four directions on the target workpiece; a shower head disposed in the chamber and opposed to the film formation surface of the target workpiece; and a gas discharge part that discharges a gas by suction to the outside of the chamber and maintains the inside of the chamber in a reduced pressure state, the shower head comprising raw material gas ejection ports for ejecting a raw material gas into the chamber and OH* forming gas ejection ports for ejecting an ozone gas and an unsaturated hydrocarbon gas into the chamber; the raw material gas ejection ports and the OH* forming gas ejection ports being alternately arranged at predetermined intervals in the two directions so as to face the film formation surface of the target workpiece; a plurality of ejection port pairs each constituted by one of the raw material gas ejection ports and one of the OH* forming gas ejection ports adjacent thereto being aligned at predetermined intervals in the two directions; the shower head further comprising inert gas ejection ports respectively arranged between the raw material gas ejection ports and the OH* forming gas ejection ports to eject therethrough an inert gas into the chamber and gas discharge ports arranged between at least any ones of the ejection ports;

the support part comprising one end-side roll around which the target workpiece is previously wound and the other end-side roll around which the target workpiece fed from the one end-side roll is to be wound, the atomic layer deposition method comprising, while moving the target workpiece placed in the chamber along the two directions, performing on the film formation surface the following steps:

a raw material gas supply step of supplying a raw material gas from the raw material gas ejection ports to the film formation surface of the target workpiece, thereby forming an adsorption layer of the raw material gas on the film formation surface, the raw material gas containing a constituent element of the oxide film;

a raw material gas purging step of removing a residue of the raw material gas supplied in the raw material gas supply step and a gas generated by adsorption of the raw material gas to the film formation surface;

an oxidant supply step of supplying an ozone gas with an ozone concentration of 20 vol % or higher and an unsaturated hydrocarbon gas from the OH* forming gas ejection ports to the film formation surface of the target workpiece, thereby oxidizing the adsorption layer formed on the film formation surface; and an oxidant purging step of removing a residue of the ozone and unsaturated hydrocarbon gases supplied in the oxidant supply step and a gas generated by oxidation of the adsorption layer of the raw material gas, wherein a dimension of the respective ejection ports of the shower head in the two directions ranges from 1 mm to 50 mm;

wherein a distance from the respective ejection ports of the shower head to the film formation surface of the workpiece ranges from 1 mm to 20 mm;

wherein a plurality of the raw material gas ejection ports are aligned in crossing directions that cross the two directions among the four directions on the film formation surface so as to constitute raw material gas ejection port groups;

wherein a plurality of the OH* forming gas ejection ports are aligned in the crossing directions so as to constitute OH* forming gas ejection port groups;

wherein the OH* forming gas ejection ports respectively have first ejection ports to eject therethrough the ozone gas and second ejection ports to eject therethrough the unsaturated hydrocarbon gas;

wherein a first pitch between the first ejection port and the second ejection port of a same pair of the OH* forming gas ejection ports is set narrower than a second pitch between any other pair of the ejection ports including the raw material gas ejection ports, the OH* forming gas ejection ports, the inert gas ejection ports, and the gas discharge ports;

wherein at least any of the ejection ports of the shower head has a slit shape elongated in the crossing directions; and wherein a pressure inside the chamber is controlled to 1000 Pa or lower in the raw material gas purging step and in the oxidant purging step; and a pressure on the film formation surface opposed to the respective ejection ports is in a range of 0.1 Pa to 1000 Pa.

2. The atomic layer deposition method according to claim 1, wherein the pressure inside the chamber is controlled to be lower than an atmospheric pressure by the gas discharge part of the atomic layer deposition device.

3. The atomic layer deposition method according to claim 1, wherein a plurality of cycles of the raw material gas supply step, the raw material gas purging step, the oxidant supply step and the oxidant purging step are performed, and the raw material gas supplied to the target workpiece in the raw material gas supply step of at least one of the plurality of cycles and the raw material gas supplied to the target workpiece in the raw material gas supply step of the remainder of the plurality of cycles are of different kinds.

4. The atomic layer deposition method according to claim 1, wherein the oxide film contains an adsorption layer of any of $Al_2O_3$, $HfO_2$, $TiO_2$, $ZnO$, $Ta_2O_3$, $Ga_2O_3$, $MoO_3$, $RuO_2$, $SiO_2$, $ZrO_2$ and $Y_2O_3$.

5. The atomic layer deposition method according to claim 1, wherein the unsaturated hydrocarbon gas is an ethylene gas.

6. The atomic layer deposition method according to claim 1, wherein the workpiece is heated within a range of 100° C. or lower or is unheated.

7. The atomic layer deposition method according to claim 1, wherein a supply rate of the raw material gas is set within a range of 0.0001 sccm to 1 sccm per unit length in a direction vertical to the two directions in the raw material gas ejection port, a supply rate of the ozone gas is set within a range of 0.1 sccm to 10 sccm per unit length in a direction vertical to the two directions in the first ejection port, and a supply rate of the unsaturated hydrocarbon gas is set within a range of 0.1 sccm to 10 sccm per unit length in a direction vertical to the two directions in the second ejection port.

8. An atomic layer deposition method for forming an oxide film on a film formation surface of a target workpiece with the use of an atomic layer deposition device, the atomic layer deposition device comprising: a chamber in which the target workpiece is placed; a support part that supports the target workpiece placed in the chamber movably along opposite two directions among four directions on the target workpiece; a shower head disposed in the chamber and opposed to the film formation surface of the target workpiece; and a gas discharge part that discharges a gas by suction to the outside of the chamber and maintains the inside of the chamber in a reduced pressure state, the shower head comprising raw material gas ejection ports for ejecting a raw material gas into the chamber and OH* forming gas ejection ports for ejecting an ozone gas and an unsaturated hydrocarbon gas into the chamber; the raw material gas ejection ports and the OH* forming gas ejection ports being alternately arranged at predetermined intervals in the two directions so as to face the film formation surface of the target workpiece; a plurality of ejection port pairs each constituted by one of the raw material gas ejection ports and one of the OH* forming gas ejection ports adjacent thereto are aligned at predetermined intervals in the two directions; the shower head further comprising inert gas ejection ports respectively arranged between the raw material gas ejection ports and the OH* forming gas ejection ports to eject therethrough an inert gas into the chamber and gas discharge ports arranged between at least any ones of the ejection ports;

the support part comprising a support stage on which the target workpiece is supported and which is movable along the film formation surface of the target workpiece, the atomic layer deposition method comprising, while moving the target workpiece placed in the chamber along the two directions, performing on the film formation surface the following steps:

a raw material gas supply step of supplying a raw material gas from the raw material gas ejection ports to the film formation surface of the target workpiece, thereby forming an adsorption layer of the raw material gas on the film formation surface, the raw material gas containing a constituent element of the oxide film;

a raw material gas purging step of removing a residue of the raw material gas supplied in the raw material gas supply step and a gas generated by adsorption of the raw material gas to the film formation surface;

an oxidant supply step of supplying an ozone gas with an ozone concentration of 20 vol % or higher and an unsaturated hydrocarbon gas from the OH* forming gas ejection ports to the film formation surface of the target workpiece, thereby oxidizing the adsorption layer formed on the film formation surface; and an oxidant purging step of removing a residue of the ozone and unsaturated hydrocarbon gases supplied in the oxidant supply step and a gas generated by oxidation of the adsorption layer of the raw material gas, wherein a dimension of the respective ejection ports of the shower head in the two directions ranges from 1 mm to 50 mm;

wherein a distance from the respective ejection ports of the shower head to the film formation surface of the workpiece ranges from 1 mm to 20 mm; and wherein a plurality of the raw material gas ejection ports are aligned in crossing directions that cross the two directions among the four directions on the film formation surface so as to constitute raw material gas ejection port groups;

wherein a plurality of the OH* forming gas ejection ports are aligned in the crossing directions so as to constitute OH* forming gas ejection port groups;

wherein the OH* forming gas ejection ports respectively have first ejection ports to eject therethrough the ozone gas and second ejection ports to eject therethrough the unsaturated hydrocarbon gas;

wherein a first pitch between the first ejection port and the second ejection port of a same pair of the OH* forming gas ejection ports is set narrower than a second pitch between any other pair of the ejection ports including the raw material gas ejection ports, the OH* forming gas ejection ports, the inert gas ejection ports, and the gas discharge ports;

wherein at least any of the ejection ports of the shower head has a slit shape elongated in the crossing directions; and wherein a pressure inside the chamber is controlled to 1000 Pa or lower in the raw material gas purging step and in the oxidant purging step, and a pressure on the film formation surface opposed to the respective ejection ports is in a range of 0.1 Pa to 1000 Pa.

9. The atomic layer deposition method according to claim 8, wherein the pressure inside the chamber is controlled to be lower than an atmospheric pressure by the gas discharge part of the atomic layer deposition device.

10. The atomic layer deposition method according to claim 8, wherein a plurality of cycles of the raw material gas supply step, the raw material gas purging step, the oxidant supply step and the oxidant purging step are performed, and the raw material gas supplied to the target workpiece in the raw material gas supply step of at least one of the plurality of cycles and the raw material gas supplied to the target workpiece in the raw material gas supply step of the remainder of the plurality of cycles are of different kinds.

11. The atomic layer deposition method according to claim 8, wherein the oxide film contains an adsorption layer of any of $Al_2O_3$, $HfO_2$, $TiO_2$, $ZnO$, $Ta_2O_3$, $Ga_2O_3$, $MoO_3$, $RuO_2$, $SiO_2$, $ZrO_2$ and $Y_2O_3$.

12. The atomic layer deposition method according to claim 8, wherein the unsaturated hydrocarbon gas is an ethylene gas.

13. The atomic layer deposition method according to claim 8, wherein the workpiece is heated within a range of 100° C. or lower or is unheated.

14. The atomic layer deposition method according to claim 8, wherein a supply rate of the raw material gas is set within a range of 0.0001 sccm to 1 sccm per unit length in a direction vertical to the two directions in the raw material gas ejection port, a supply rate of the ozone gas is set within a range of 0.1 sccm to 10 sccm per unit length in a direction vertical to the two directions in the first ejection port, and a supply rate of the unsaturated hydrocarbon gas is set within a range of 0.1 sccm to 10 sccm per unit length in a direction vertical to the two directions in the second ejection port.

\* \* \* \* \*